United States Patent
Zhang et al.

(10) Patent No.: US 6,436,819 B1
(45) Date of Patent: Aug. 20, 2002

(54) NITROGEN TREATMENT OF A METAL NITRIDE/METAL STACK

(75) Inventors: Zhi-Fan Zhang, San Jose, CA (US); David Pung, Portland, OR (US); Nitin Khurana, Santa Clara, CA (US); Hong Zhang, Freemont, CA (US); Roderick Craig Mosely, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/495,817

(22) Filed: Feb. 1, 2000

(51) Int. Cl.[7] .............................................. H01L 21/44

(52) U.S. Cl. ...................... 438/656; 438/658; 438/660; 438/681

(58) Field of Search ................................. 438/656, 653, 438/654, 658, 660, 681, 685

(56) References Cited

U.S. PATENT DOCUMENTS

| | | | |
|---|---|---|---|
| 5,175,126 A | 12/1992 | Ho et al. | 437/190 |
| 5,279,857 A | 1/1994 | Eichman et al. | 427/255 |
| 5,308,655 A | 5/1994 | Eichman et al. | 427/248.1 |
| 5,610,106 A | 3/1997 | Foster et al. | 437/245 |
| 5,665,640 A | 9/1997 | Foster et al. | 438/680 |
| 5,716,870 A | 2/1998 | Foster et al. | 437/192 |
| 5,866,213 A | 2/1999 | Foster et al. | 427/573 |
| 5,972,179 A | * 10/1999 | Chittipeddi et al. | |
| 5,975,912 A | * 11/1999 | Hillman et al. | |
| 5,989,652 A | 11/1999 | Ameen et al. | 427/534 |
| 6,060,389 A | * 5/2000 | Brennan et al. | |
| 6,093,639 A | * 7/2000 | Wu et al. | |
| 6,093,645 A | * 7/2000 | Ameen et al. | |
| 6,096,645 A | * 8/2000 | Lo et al. | |
| 6,215,186 B1 | * 4/2001 | Konecni et al. | |

FOREIGN PATENT DOCUMENTS

| | | | |
|---|---|---|---|
| DE | 196 45 033 A1 | 5/1997 | .......... H01L/21/283 |
| EP | 0 711 846 A1 | 5/1996 | ............ C23C/16/34 |
| EP | 0 720 214 A2 | 7/1996 | .......... H01L/21/321 |
| GB | 2 306 777 | 5/1997 | .......... H01L/23/532 |
| JP | 63-229814 | 3/1987 | ............ H01L/21/28 |
| JP | 7-221048 | 12/1995 | .......... H01L/21/285 |

OTHER PUBLICATIONS

Ikeda et al "Film Texture Evolution in Plasma Treated TiN thin Films" Journal of Applied Physics, vol. 86, No. 4, pp. 2300–2306, Aug. 15, 1999.

Wang et al "Optimization of PVD Ti/CVD TiN Liner for 0.35 $\mu$m Tungsten Plug Technology" Materials Research Society Symposium Proceedings, vol. 427, pp. 383–387, Apr. 8–11, 1996.

(List continued on next page.)

Primary Examiner—Keith Christianson
Assistant Examiner—Stephen W. Smoot
(74) Attorney, Agent, or Firm—Moser, Patterson & Sheridan LLP

(57) ABSTRACT

A method for processing a substrate comprising the formation of a metal nitride/metal stack suitable for use as a barrier/liner for sub-0.18 $\mu$m device fabrication. After a metal nitride layer is deposited upon a metal layer, the metal nitride layer is exposed to a treatment step in a nitrogen-containing environment, e.g., a plasma. The plasma treatment modifies the entire metal nitride layer and a top portion of the underlying metal layer. The plasma adds nitrogen to the top portion of the metal layer, resulting in the formation of a nitrated-metal layer. Aside from reducing the microstructure mismatch across the nitride-metal interface, the plasma treatment also densifies and reduces impurities from the deposited nitride layer. The resulting nitride/metal stack exhibits improved film properties, including enhanced adhesion and barrier characteristics. A composite nitride layer of a desired thickness can also be formed by repeating the deposition and treatment cycles of thinner component nitride layers.

25 Claims, 10 Drawing Sheets

OTHER PUBLICATIONS

Konecni et al "A Stable Plasma Treated CVD Titanium Nitride Film for Barrier/Glue Layer Applications" Vmic Conference, pp. 181–183, Jun. 18–20, 1996.

Kim et al "The Effect of In–Situ N2/H2 Plasma treatment on the Propertiers of Chemically Vapor Deposited TiN" *Electrochemical Society Proceedings* vol. 97–25 pp. 1626–1633, Sep., 1997.

M. Eizenberg "Chemical Vapor Deposition of TiN for ULSI Applications", *Mat. Res. Soc. Symp. Proc.*, vol. 427, pp. 325–335, 1996.

Danek et al "Resistivity Reduction and Chemical Stabilization of Organometallic Chemical Vapor Deposited Titanium Nitride by Nitrogen RF Plasma" *Appl. Phys. Lett 68(7)*, pp. 1015–1016, Feb. 12, 1996.

Kim et al. "Effect of $N_2/H_2$ Plasma Treatment on the Properties of TiN Films Prepared by Chemical Vapor Deposition from $TiCl_4$ and $NH_3$" Jpn. J. Appl. Phys., vol. 38, Part 2, No. 4B, pp. L461–L463, Apr. 15, 1999.

Hamamura et al., "Structural Change of $TiN/Ti/SiO_2$ Multilayers by N2 Annealing", Thin Solid Films, vol. 320, (1998) 31–34.

Mouroux et al, "Impact of Rapid Thermal Annealing of Ti/TiN Bilayers on Subsequent Chemical Vapor Deposition of Tungsten", Mat. Res. Soc. Symp. Proc. vol. 427, 1996 Materials Research Society, pp. 365–370.

M.M. Farahani, et al., "Limitation of the TiN/Ti Layer formed by the Rapid Thermal Heat Treatment of Pure Ti Films in an NH3 Ambient in Fabrication of Submicrometer CMOS Flash EPROM IC's", IEEE Transactions on Semiconductor Manufacturing, vol. 10, No. 1, Feb. 1, 1997 pp. 147–153.

* cited by examiner

NITROGEN TREATMENT OF A METAL NITRIDE/METAL STACK

BACKGROUND OF THE INVENTION

1. Field of the Invention

The invention relates to a method of processing a substrate for semiconductor device fabrication. More particularly, the invention relates to a method for improving film properties of a metal nitride/metal stack.

2. Description of the Background Art

In the fabrication of very large scale integration (VLSI) and ultra large scale integration (ULSI) integrated circuits, increasingly stringent demands are placed on the process capability and reliability of multilevel metallization techniques. Tungsten (W) has emerged as an alternative to aluminum (Al) in metallization techniques at various levels, including contact and vias.

An integrated barrier/liner structure is typically used to provide good adhesion between the metal conducting layer (W or Al) and the underlying material layer, as well as to prevent undesirable metal diffusion into the underlying layer.

These barrier/liner structures typically comprise refractory metal nitride/refractory metal combinations—e.g., titanium nitride (TiN)/titanium (Ti), among others.

Titanium (Ti), for example, has been used as a glue or adhesion layer between silicon (Si) or silicon dioxide ($SiO_2$) and a metal layer comprising Al or W. A barrier layer comprising, for example, TiN, is deposited upon the Ti adhesion layer prior to metal deposition to avoid metal diffusion into the underlying substrate.

Titanium nitride can be deposited by physical vapor deposition (PVD) as well as chemical vapor deposition (CVD).

However, CVD TiN may have an amorphous structure—e.g., when deposited from a metallo-organic titanium precursor, as opposed to the more orderly PVD Ti or PVD TiN layers. This difference in microstructure results in an integrated CVD TiN/PVD Ti stack having a weaker interfacial link than a PVD TiN/PVD Ti stack. Aside from weaker layer adhesion, structural discontinuity between the TiN and Ti layers also results in high inter-layer stress and interfacial defects.

Such a barrier/liner structure is often vulnerable to chemical and/or mechanical attack in subsequent processing steps such as W deposition, chemical cleaning and chemical mechanical polishing (CMP).

Furthermore, subsequently deposited aluminum may also diffuse through defects in the lattice or microstructure of the TiN/Ti stack to react with the underlying materials.

Therefore, a need exists for a process that will provide for an improved interfacial structure between a metal layer and a metal nitride layer that would prevent inter-metal diffusion, improves inter-layer adhesion, and improves chemical resistance during multilevel metallization processes.

SUMMARY OF THE INVENTION

The present invention is a method of forming a nitride layer on a metal layer, followed by modifying or treating the nitride and at least a portion of the underlying metal layer by exposing the nitride layer to a nitrogen-containing environment.

Metal nitride/metal stacks formed according to the embodiments of the present invention have improved properties such as enhanced adhesion, reduced interfacial stress and decreased resistivity. Such a structure, for example, is well-suited for barrier/liner applications in different metallization techniques for sub-0.18 $\mu$m applications.

The nitrogen-containing environment may comprise gases such as nitrogen ($N_2$) or ammonia ($NH_3$), among others. Alternatively, the nitrogen-containing environment may also comprise hydrogen. The modification of the metal nitride/metal layers can be performed using plasma or thermal annealing. In one embodiment of the invention, a nitrogen-containing plasma is generated from a gas comprising a mixture of $N_2$ and hydrogen ($H_2$), or $NH_3$.

The metal layer may comprise a refractory metal such as titanium (Ti), tantalum (Ta), tungsten (W), or combinations thereof, and may be deposited by either physical vapor deposition (PVD) or chemical vapor deposition (CVD). The metal nitride layer preferably comprises the same metal as the underlying refractory metal.

In one embodiment of the invention, titanium nitride (TiN) is deposited from a metallo-organic precursor. After TiN deposition, both the TiN layer and the underlying Ti layer are modified by exposing the layer stack to a nitrogen-containing environment for a sufficiently long time to allow active species to penetrate the TiN layer and reach the underlying Ti layer. When the as-deposited TiN layer is treated in an environment comprising both nitrogen and hydrogen, the resulting TiN layer exhibits a reduced impurity content and lower sheet resistance. According to the present invention, a thin nitrated-Ti layer is also formed between the treated TiN and Ti layers. This nitrated-Ti layer provides better lattice matching between the untreated portion of the Ti layer and the treated TiN layer, and leads to an integrated TiN/Ti structure with improved barrier characteristics and reduced inter-layer stress.

In another embodiment, a composite metal nitride layer is formed upon a metal layer by repeatedly depositing and treating relatively thin metal nitride layers for additional cycles, until a desired nitride thickness is obtained. For each plasma treating step, the entire uppermost nitride layer and a top portion of the underlying material layer are modified, resulting in changes in chemical composition and/or lattice structure. As a result, better lattice matching is obtained across the layer interface, leading to enhanced adhesion and reduced interfacial stress.

Optionally, the embodiments of the present invention may further comprise the step of treating the as-deposited metal layer in a first nitrogen-containing environment, prior to the deposition of a metal nitride layer. Such a treatment, for example, leads to the formation of a thin nitrated-metal layer, which provides better lattice matching between the untreated portion of the metal layer and the subsequently deposited metal nitride layer. As such, the resulting metal nitride/metal stack has enhanced adhesion and reduced stress. The as-deposited metal nitride layer is subsequently treated in a second nitrogen-containing environment, which may optionally comprise hydrogen. The treatment, which is preferably performed in a plasma, modifies both the metal nitride layer and at least a portion of the underlying nitrated-metal layer, resulting in improved film characteristics and interfacial properties.

BRIEF DESCRIPTION OF THE DRAWINGS

The teachings of the present invention can readily be understood by considering the following detailed description in conjunction with the accompanying drawings, in which.

To facilitate understanding, identical reference numerals have been used, where possible, to designate identical elements that are common to the figures.

DETAILED DESCRIPTION

Overview

The present invention is a method of forming a nitride/metal stack by forming a nitride layer upon a metal layer, followed by treating the nitride layer and a portion of the metal layer in a nitrogen-containing environment. Advantageously, this method results in improved interfacial properties of the nitride/metal stack. The method can be used, for example, to form a metal nitride/metal stack as a barrier/liner structure in a metallization scheme.

In one embodiment of the invention, a refractory metal layer is formed by PVD upon a substrate structure, followed by a deposition of a metal nitride layer by thermal CVD. The metal nitride layer is then exposed to a nitrogen-containing environment, during which the entire thickness of the metal nitride layer is treated, resulting in improved physical and chemical characteristics. The treatment can either be performed using plasma or thermal annealing, although plasma annealing is generally preferred. The treatment step of the present invention is applied for a duration that is sufficient to also partially treat the underlying refractory metal layer, leading to an incorporation of nitrogen (N) into at least a top portion of the underlying metal layer. The structural discontinuity between the metal and metal nitride layers is thus reduced, resulting in an improved interface between the two layers.

In an alternative embodiment, the metal nitride deposition and plasma anneal steps are repeated for additional cycles, in order to form a composite metal nitride layer having a desired thickness. Since each of the plasma treatment steps modifies both the top metal nitride layer as well the top portion of the underlying layer, improved interfacial structure can be obtained between each of the component material layers.

Alternatively, plasma treatment of the PVD metal layer is performed prior to the deposition of a metal nitride layer, resulting in the formation of a thin nitrated-metal layer upon the PVD metal layer. Subsequently, a metal nitride layer is deposited upon the nitrated-metal layer, and subjected to plasma treatment according to the present invention. The metal nitride layer and a top portion of the underlying nitrated-metal layer are thus modified, and exhibit improved barrier properties and chemical resistance in subsequent processing steps.

Apparatus

The processes of the present invention can be performed in either a multi-chamber processing apparatus (e.g., a cluster tool) having both PVD and CVD chambers, or separate single-chamber systems. The use of a multi-chamber apparatus is preferred because the substrate can be kept within a vacuum environment to prevent contamination between processing steps. Examples of cluster tools include P5000, Endura and Centura platforms used in conjunction with processing chambers such as a Vectra IMP, Coherent and Standard PVD chamber, a TxZ or a HP TxZ CVD chamber. These cluster tools are commercially available from Applied Materials, Inc., Santa Clara, Calif.

Figure 1:
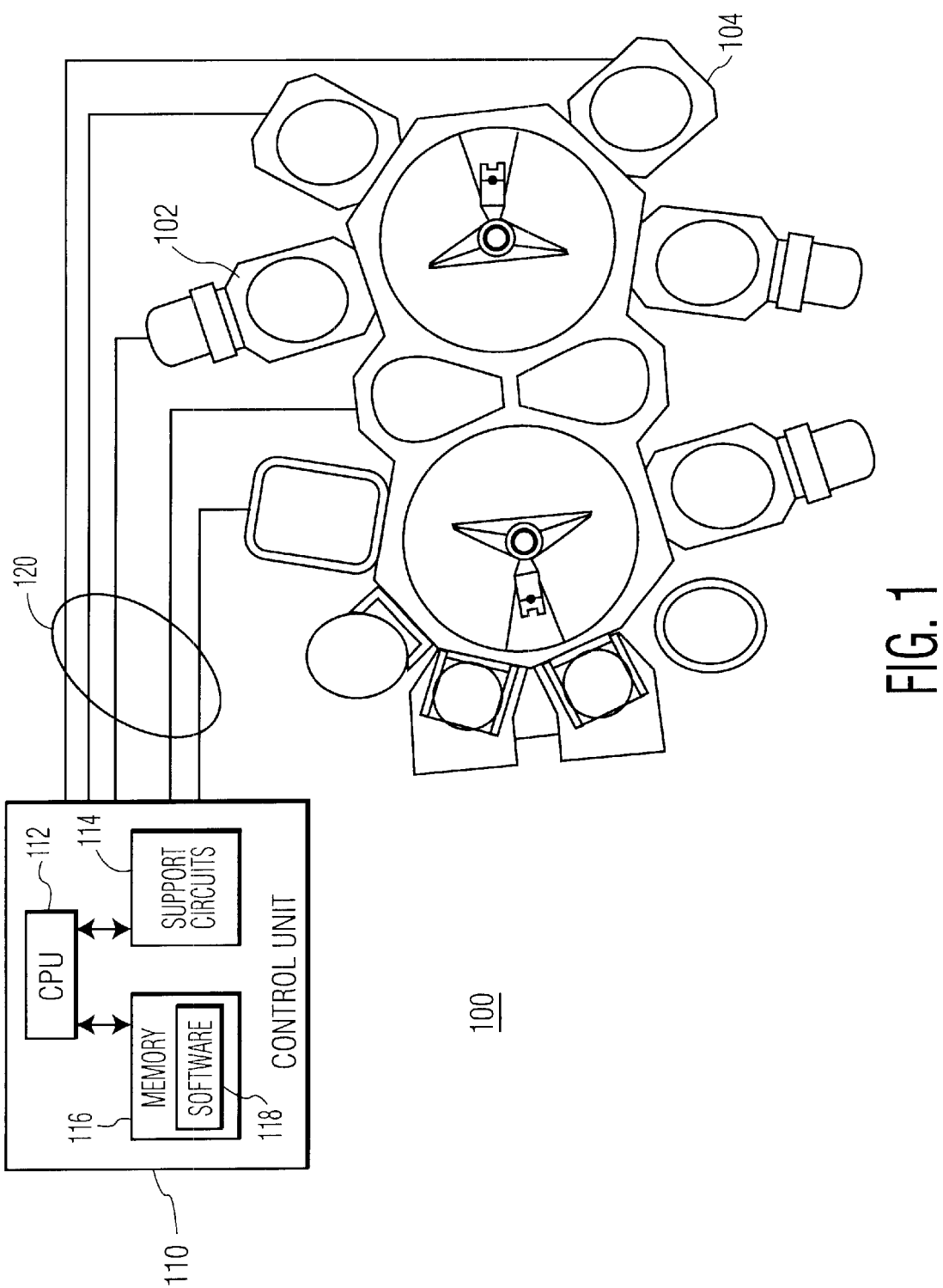
FIG. 1 depicts a schematic top view of a multi-chamber apparatus suitable for performing the processes of the present invention.

FIG. 1 depicts a schematic illustration of a multi-chamber processing apparatus 100, e.g., an Endura system, suitable for performing the CVD and PVD processes of the present invention. A similar staged-vacuum wafer processing system is disclosed in U.S. Pat. No. 5,186,718, entitled "Staged-Vacuum Wafer Processing System and Method," issued to Tepman et al. on Feb. 16, 1993, which is incorporated herein by reference. The particular embodiment of the apparatus 100 shown herein is suitable for processing planar substrates, such as semiconductor substrates, and is provided to illustrate the invention, and should not be used to limit the scope of the invention. The apparatus 100 typically comprises a cluster of interconnected process chambers, for example, a CVD chamber 102 and a PVD chamber 104.

Computer System

The processes of the present invention can be implemented using a computer program product or microprocessor controller that executes on a conventional computer system. As illustrated in FIG. 1, a control unit 110 comprises a central processor unit (CPU) 112, support circuitry 114, and memories 116 containing associated control software 118. The control unit 112 is used for automated control of the numerous steps required for wafer processing—such as wafer transport, gas flow control, temperature control, chamber evacuation, and so on. Bi-directional communications between the control unit 112 and various components of the apparatus 100 are handled through numerous signal cables collectively referred to as signal buses 120, some of which are illustrated in FIG. 1.

A computer program code for implementing the processes can be written in any conventional computer readable programming language such as 68000 assembly language, C, C++, or Pascal. The program code is then stored or embodied in a computer usable medium.

Figure 9:
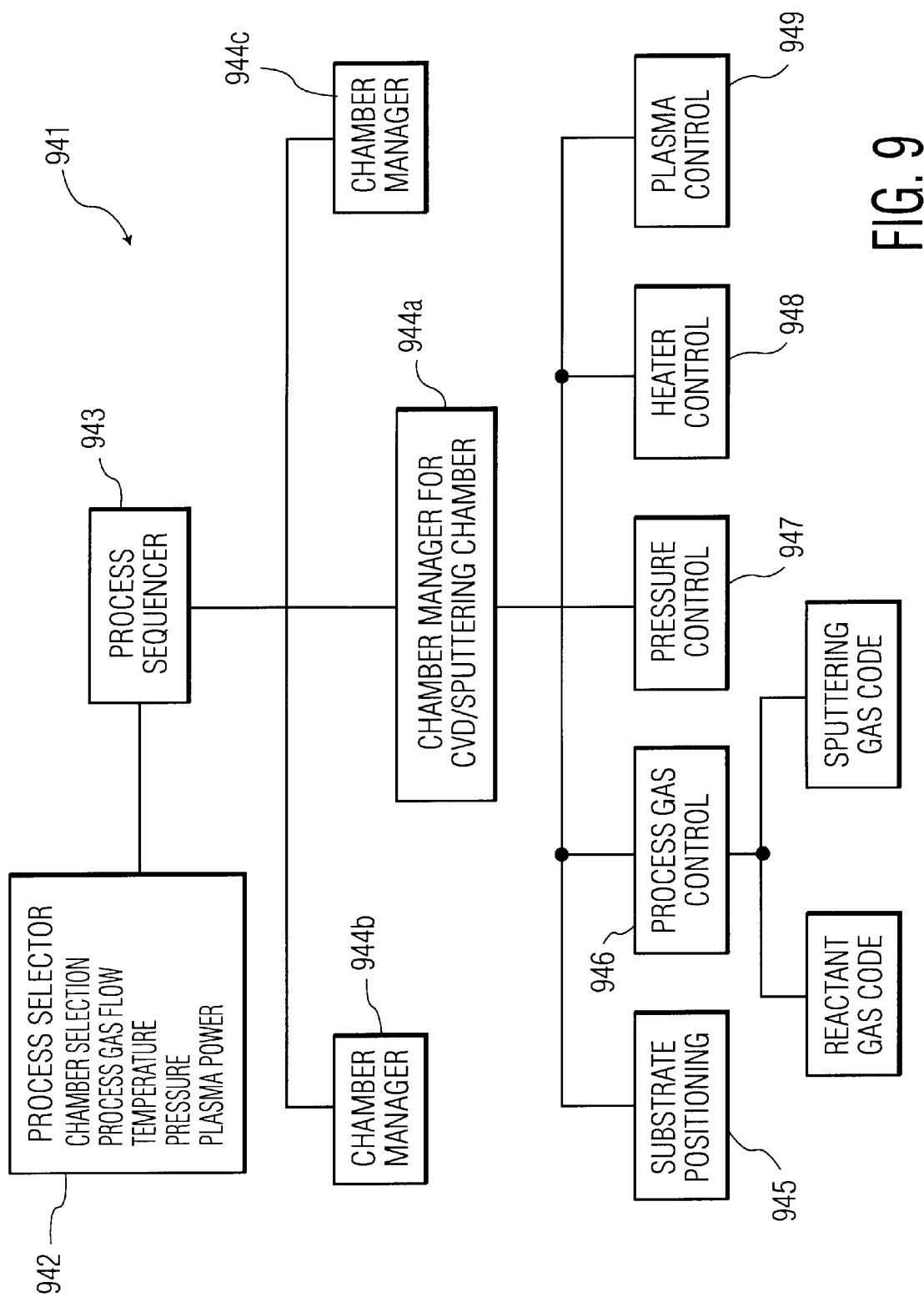
FIG. 9 depicts a simplified block diagram showing the hierarchical control structure of a computer program used for performing the processes of the present invention.

FIG. 9 shows an illustrative block diagram of the hierarchical control structure of the control unit 110. A user enters a process set and process chamber number into a process selector subroutine 942. The process sets are predetermined sets of process parameters or recipes (e.g., gas flow rates, temperature, pressure, . . . , etc.) necessary to perform specified processes in a specific process chamber.

A process sequencer subroutine 943 comprises program code for accepting the identified process chamber and set of process parameters from the process selector subroutine 942, and for controlling operation of the various process chambers. Preferably the sequencer subroutine 943 includes a program code to perform the steps of (i) monitoring the operation of the process chambers to determine if the chambers are being used, (ii) determining what processes are being performed in the chambers being used, and (iii) executing the desired process based on availability of a process chamber and type of process to be carried out.

Once the sequencer subroutine 943 determines which process chamber and process set combination is going to be executed next, the particular process set parameters are passed to the chamber manager subroutines 944a–c which control multiple processing tasks in different process chambers. The chamber manager subroutines 944a–c also control execution of various chamber component subroutines or program code modules, which control operation of the chamber components necessary to accomplish the necessary process set. Examples of chamber component subroutines are substrate positioning subroutine 945, process gas control subroutine 946, pressure control subroutine 947, heater control subroutine 948, and plasma control subroutine 949. Those having ordinary skill in the art would readily recognize that other chamber control subroutines can be included depending on what processes are desired to be performed in the process chamber 102.

PVD Chamber

The PVD deposition chamber 104 is used for depositing a metal layer, e.g., titanium (Ti), by sputtering from a metal target inside the chamber 104. Details of a PVD chamber, e.g., Model Vectra IMP, have been disclosed in commonly-assigned U.S. Pat. No. 6,200,433, entitled "IMP Technology with Heavy Gas Sputtering", issued Mar. 13, 2001, which is herein incorporated by reference. During the sputtering process, an inert gas, such as argon (Ar) or xenon (Xe), is introduced into the chamber 104. A DC bias current is applied to the sputtering target, with a chamber shield being electrically grounded. An RF bias voltage is applied to the substrate support. A plasma is generated from the inert gas by applying a DC voltage of about 100–20,000 W, and more typically about 100–10,000 W, to the sputtering target. Target materials are sputtered from the target by the plasma, and deposited on the substrate surface. The chamber 104 can also be used for plasma treating the deposited metal film. For example, after the metal layer is deposited, a nitrogen-containing plasma may be generated by introducing nitrogen ($N_2$), or other nitrogen-containing gas, into the chamber and applying a RF power of about 10–10000 W, or more typically about 600–2000 W.

CVD Chambers a. TxZ Chamber

Figure 2:
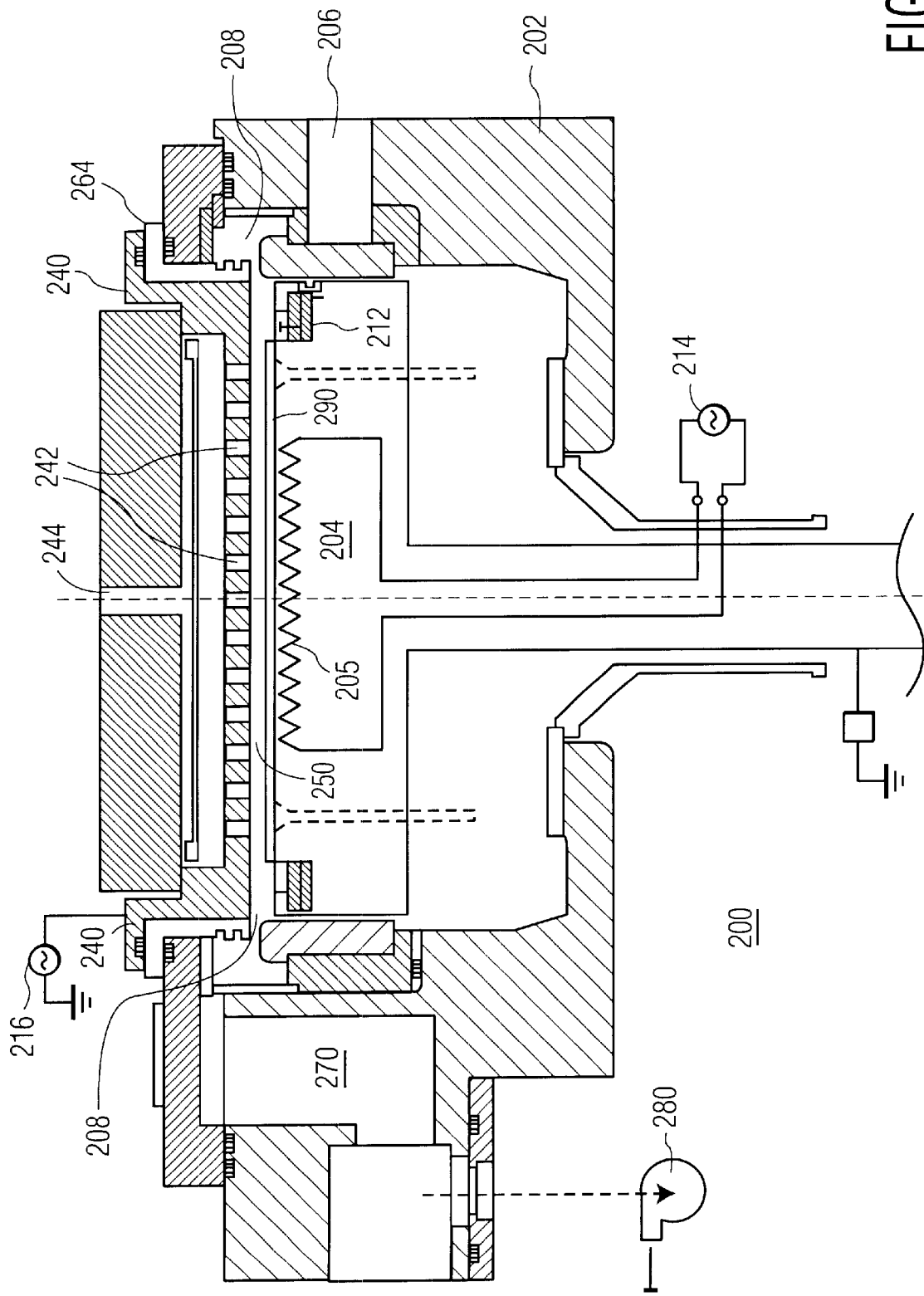
FIG. 2 depicts a schematic cross-sectional view of a chemical vapor deposition chamber suitable for performing the processes according to the present invention.

FIG. 2 illustrates a schematic cross-sectional view of an example of a CVD plasma reactor 102 suitable for performing the process of the present invention. This specific reactor, a TXZ chamber 200, is available commercially from Applied Materials, Inc., of Santa Clara, Calif. Details of this chamber have been disclosed, for example, in commonly-assigned U.S. Pat. No. 5,846,332, entitled "Thermally Floating Pedestal Collar in a Chemical Vapor Deposition Chamber", issued Dec. 8, 1998, and commonly-assigned U.S. Pat. No. 5,993,916, entitled "Method for Substrate Processing with Improved Throughput and Yield", issued Nov. 30,1999, both which are incorporated herein by reference. The TXZ chamber 200 is adapted for operation in a reduced pressure environment through connection to a vacuum pump 280 via a pumping channel 208. The chamber 200 comprises a chamber body 202 and a pedestal 204 that supports a substrate 290 to be processed. The substrate 290 is transferred in and out of the chamber 200 through a slit valve 206, and is centered upon the pedestal 204 by a centering ring 212. A suitable robotics transfer assembly is described in commonly assigned U.S. Pat. No. 4,951,601, entitled "Multi-chamber Integrated Process System", issued on Aug. 28, 1990, the complete disclosure of which is incorporated herein by reference.

During processing, the substrate 290 is placed in close proximity to a gas distribution faceplate, or a showerhead 240, which includes a larger number of passageways 242 to allow the flow of a process gas from a gas inlet 244 into a processing zone 250 inside the chamber 200. Film deposition occurs on the surface of the substrate 290 when the process gas reacts at the heated substrate 290. Any excess process gas and byproducts are subsequently pumped out of the chamber 200 through an annular pumping channel 208, which is connected to a pumping plenum 270.

The CVD chamber 200 of FIG. 2 can be operated in two modes, thermal and plasma-enhanced. In the thermal mode, an electrical power source 214 supplies power to a resistive heater 205 of the pedestal 204. The pedestal 204, and thus the substrate 290, are maintained at an elevated temperature sufficient to thermally activate the CVD reaction. In the plasma-enhanced mode, RF power from an RF source 216 is applied to the showerhead 240, which acts as an upper electrode. The showerhead 240 is electrically insulated from the rest of the chamber 200 by the annular isolator ring 264, typically made of an electrically non-conductive ceramic. Sufficient voltage and power is applied by the RF source 216 to generate a plasma from the process gases within the processing region 250. The chamber 200 is designed to minimize undesirable deposition upon various chamber components—e.g., the centering ring 212 is maintained at a lower temperature than the pedestal 204, such that film deposition on the centering ring can be minimized.

The CVD TxZ chamber 200 can be used for either thermal or plasma enhanced CVD processes with different precursor gases, including metallo-organic precursors (e.g., tetrakis-(dialkylamino) titanium compounds) or titanium tetrahalides.

A metallo-organic precursor, for example, tetrakis-(dimethylamino) titanium, $Ti(N(CH_3)_2)_4$, or TDMAT, is injected into the chamber 200 through the showerhead 240. The chamber pressure is maintained within a range of about 0.01 Torr to about 50 Torr, while the pedestal 204 maintains the substrate 290 at a temperature of at least about 100° C., or preferably about 300° C.–500° C. Thermal decomposition of TDMAT results in the deposition of a conductive and conformal TiN layer upon a substrate 290.

b. HP TxZ Chamber

Figure 3:
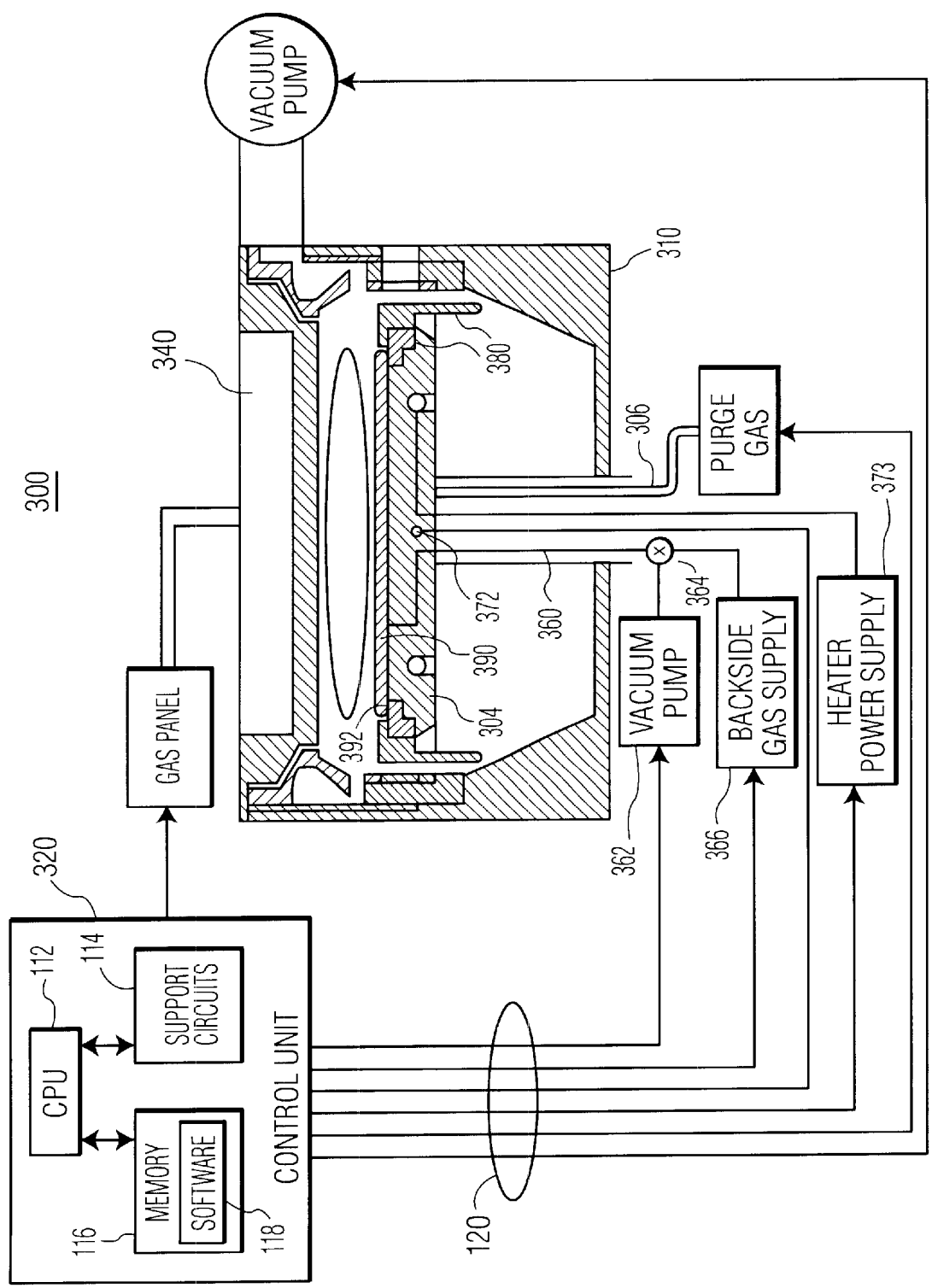
FIG. 3 depicts a schematic cross-sectional view of a chemical vapor deposition chamber with purge capability for performing the processes according to the present invention.

Alternatively, the CVD processes of the present invention can be performed in a HP TXZ chamber 300, a cross-sectional view of which is depicted in FIG. 3. Unlike the standard TXZ chamber, the wafer heater pedestal 304 of the HP TXZ chamber 300 is equipped with a purge ring/edge ring assembly 380, allowing a purge gas to flow around the bottom and edge of the wafer pedestal 304, preventing undesirable deposits from accumulating in these areas. Details of the purge ring assembly have been disclosed in a commonly-assigned U.S. Pat. No. 6,159,299, entitled "Wafer Pedestal with a Purge Ring", issued on Dec. 12, 2000, which is herein incorporated by reference. Some features of special interest to the present process are briefly described below.

Similar to the TXZ chamber, a substrate, such as a wafer 390, is retained on the pedestal 304 by vacuum chucking. Unlike the TXZ chamber, however, a backside gas pressure can optionally be established upon the back surface, or backside 392, of the wafer 390. This is accomplished by a vacuum line 360, which is connected to both a vacuum pump 362 and a gas supply 366 via a three-way valve 364. A control unit 320 maintains a proper backside gas flow and pressure by controlling the valve 364, vacuum pump 362 and backside gas supply 366. In this embodiment, the thermal conduction between the heated pedestal 304 and the wafer 390 is improved by the use of the backside gas. Pedestal temperature control is accomplished by a feedback control loop, in which the temperature of the pedestal 304 is continuously monitored by a thermocouple 372 inside the pedestal 304, and adjustments of the current output of a heater power supply 373 are made by the control unit 320. The improved wafer temperature control results in higher uniformity in the deposited film.

During cleaning and post-deposition annealing processes, the showerhead 340 is RF biased with respect to the grounded chamber body 310 such that a plasma can be generated from appropriate process gases for chamber-cleaning or substrate treatment purposes.

Figure 4:
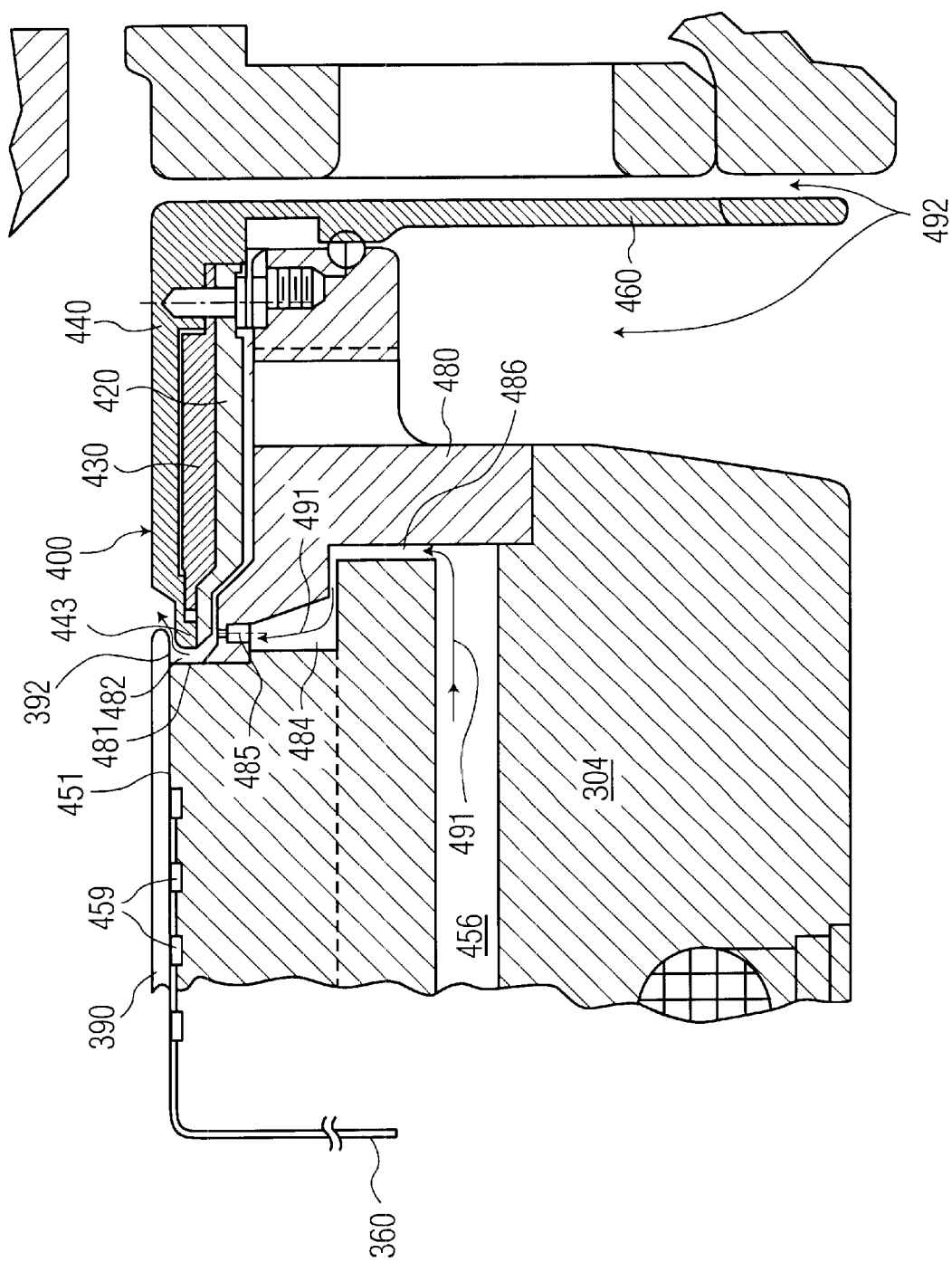
FIG. 4 depicts an expanded partial sectional view around the pedestal inside the chamber of FIG. 3.

FIG. 4 shows an expanded, partial cross-sectional view around the pedestal 304. The purge ring/edge ring assembly 380 comprises a purge ring 480 disposed circumferentially around the pedestal 304, and a removable edge ring assembly 400 resting upon the purge ring 480.

Inside the pedestal 304 are several horizontal channels 456 for the introduction of a purge gas. Other channels 459, which are connected to the vacuum line 360, are provided on the wafer support surface 451 of the pedestal 304 for vacuuming chucking and for supplying a backside gas to the wafer 390. The purge ring 480, in conjunction with the pedestal 304, directs the purge gas to flow around the vertical edge 481 located at the top portion 304T of the pedestal 304.

The edge ring assembly 400, comprising a top ring 440, a middle ring 430, and a lower ring 420, is readily removable to facilitate cleaning and maintenance. It is designed such that the top ring 440 is maintained at a temperature lower than that of the purge ring 480, and undesirable deposits upon the edge ring components can be minimized.

During wafer processing, a first purge gas from a channel 456 enters a space 484 via a channel 486. The gas then flows through numerous small holes 485 in the purge ring 480 into another space 482 adjacent to a vertical edge 481 of the pedestal 304. This edge purge flow pattern, illustrated by the arrow 491, helps prevent undesirable film deposition on the vertical edge 481 of the pedestal 304, on the backside 392 of the wafer 390, and on the inside portion 443 of the top ring 440.

A bottom purge flow, indicated by the arrow 492, is established by a second purge gas flowing around an elongated, vertical portion 460 of the top ring 440 of the edge ring assembly 400. This bottom purge gas flow is introduced by a gas line 306 shown in FIG. 3 through the bottom of the chamber 300, and helps minimize undesirable deposition on the edge ring assembly 400.

The dual-purge capability results in a dramatic improvement in chamber performance, both by extending the time between cleans as well as preventing micro-arcing and particulate contamination.

Ti/TiN Process

Figure 5A:
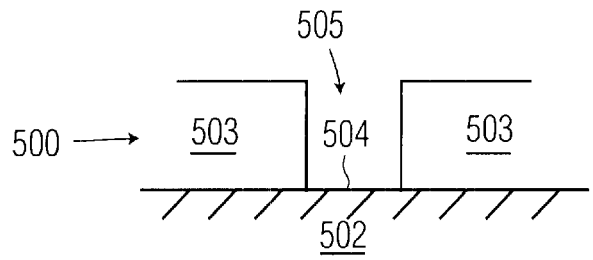
FIGS. 5a–e depict schematic partial sectional views of a substrate structure during different stages of processing according to one embodiment of the present invention.
Figure 5B:
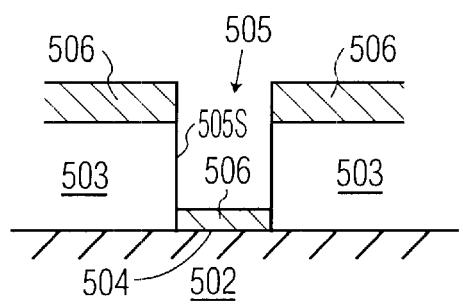

FIGS. 5a–e depict cross-sectional views of a substrate 502 during different stages of integrated circuit device fabrication according to a first embodiment of the invention. In general, the substrate 502 refers to any workpiece upon which film processing is performed, and a substrate structure 500 is used to generally denote the substrate 502 together with other material layers formed upon the substrate 502. In particular, FIG. 5a–e illustrates the formation of a liner/barrier stack inside a contact hole, trench or via structure. FIG. 5a shows an insulating layer 503 formed upon an underlying substrate 502, which may comprise aluminum, silicon, tungsten, among others. The insulating layer 503 is, for example, a dielectric such as an oxide layer. Using conventional lithographic and etching techniques, an opening 505, which may correspond to a contact hole, trench or via, is formed in the insulating layer 503, exposing a portion 504 of the underlying substrate 502. An adhesion or liner layer 506 is then formed upon the insulating layer 503 and the exposed portion 504 of the substrate 502, as shown in FIG. 5b. In general, the liner layer 506 comprises a refractory metal—e.g., Ti, Ta, and W, which may be formed using conventional deposition methods such as PVD or CVD. For example, a Ti layer 506 may be deposited in a PVD chamber 104 of FIG. 1, using any of the PVD techniques such as IMP PVD, collimated sputtering or long throw sputtering. If tantalum (Ta) is deposited as the liner layer, an IMP PVD process is preferable, especially for high aspect ratio features. Due to the non-conformal nature of PVD-deposited films, there is usually relatively little, if any, of the metal on the sidewall 505S of the via 505. In general, the thickness of the metal liner layer 506 may be in the range of about 5 Å to about 1000 Å, and preferably about 100 Å.

Figure 5C:
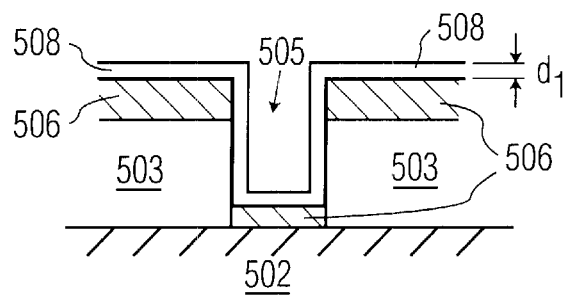

FIG. 5c shows the subsequent formation of a barrier layer 508 upon the metal layer 506, using for example, a CVD technique. The barrier layer 508 may comprise a metal nitride such as TiN, tantalum nitride, or tungsten nitride, deposited using appropriate precursors. For example, the metal nitride layer 508 comprising TiN may be deposited in either a TxZ or HP TxZ CVD chamber from a TDMAT precursor. Alternatively, TiN may also be deposited from a $TiCl_4$-based reaction, such as that between $TiCl_4$ and $NH_3$.

Figure 5D:
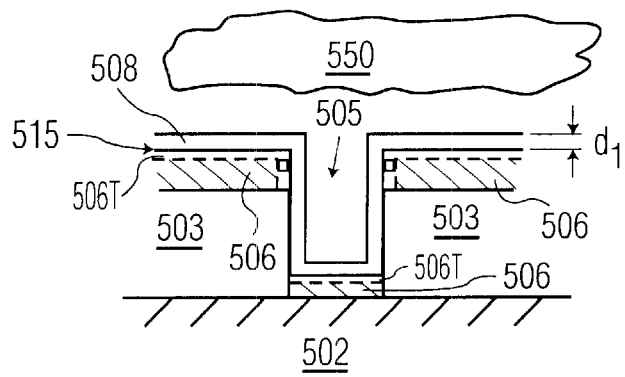

In one embodiment, the metal nitride layer 508 is deposited to a thickness $d_1$, e.g., in the range of about 5 Å to about 1000 Å, and preferably about 60 Å. The as-deposited metal nitride layer 508 is then exposed to a nitrogen-containing plasma 550, as shown in FIG. 5d. The plasma 550 may be generated from nitrogen-containing gases, e.g., $N_2$ or $NH_3$, among others. Typical process conditions may include a $N_2$ flow rate in the range of about 100–3000 sccm, preferably about 100–500 sccm, and most preferably about 200–300 sccm; a pressure range of about 1 mtorr–25 torr, preferably about 1–10 torr, and most preferably about 1–6 torr; and a temperature range between room temperature and about 1000° C., preferably about 300–500° C. A plasma power of about 10 W to about 10000 W may be used, preferably in the range of about 600–2000 W, and most preferably, about 750 W. However, process conditions may vary for different models of processing chambers used.

The as-deposited barrier layer 508 is modified by different species in the plasma 550, which may comprise neutral or ionic, atomic or molecular entities. Depending on the specific conditions, the plasma treatment may lead to changes in film density, lattice structure, or film composition. Thus, the thickness $d_{1t}$ of the treated layer 509 (shown in FIG. 5e) is usually less than the thickness $d_1$ of the as-deposited layer 508. For example, a 60 Å thick as-deposited TiN layer may be densified to result in a 20 Å thick layer after plasma treatment.

Referring back to FIG. 5d, the present invention treats the entire thickness $d_1$ of the barrier layer 508 as well as a top portion 506T of the underlying layer 506. This can be accomplished, for example, by using different combinations of process parameters—e.g., an extended plasma treatment time, increased RF power, and so on. After such "over-treatment" (results of which are shown in FIG. 5e), the treated barrier layer 509 becomes more uniform in its film properties, e.g., density, chemical composition, lattice structure, sheet resistance, and so on, compared to a partially-treated layer.

Furthermore, when the metal nitride layer 508 is sufficiently thin, or the plasma treatment time is sufficiently long, a top or outer portion 506T of the underlying metal layer 506 adjacent to the interface 5 (formed between the as-deposited liner layer 506 and the barrier layer 508—see FIG. 5d) is also modified by the plasma. This occurs when some of the active species from the plasma 550 penetrate the barrier layer 508 to the underlying metal layer 506. By varying the power and pressure conditions of the plasma, the sidewall portion of the metal layer 506 can also be treated or modified. Such modifications may include changes in film composition or lattice structure, which may in turn affect film stress, resistivity and density.

Figure 5E:
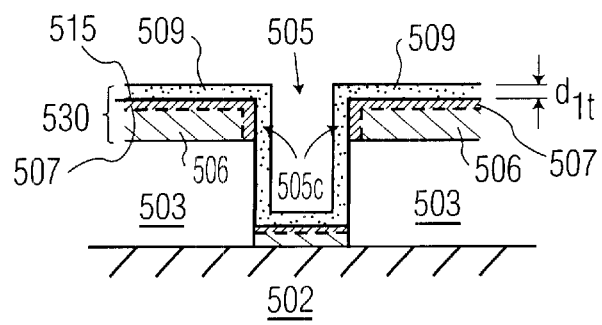

For example, FIG. 5e illustrates that over-treatment by a nitrogen-containing plasma leads to the formation of a thin, "nitrated-metal" layer 507 upon the remaining untreated metal layer 506. This may also be referred to as nitration or nitrogen-stuffing—e.g., nitrogen being bonded with Ti or nitrogen atoms being stuffed between Ti grain boundaries. After plasma over-treatment, compositional and/or structural discontinuities across the interface 5 are reduced, and the barrier/liner stack 530 exhibits a lower inter-layer stress.

In general, a better atomic lattice structure matching between adjacent layers 506 and 508 reduces inter-layer stress and decreases layering defects or adhesion problems. For example, PVD-deposited films (e.g., Ti layer 506) tend to be more orderly and have tensile stress, while some CVD-deposited layers (e.g., TiN layer 508 from TDMAT precursor) tend to be more amorphous and have compressive stress. During subsequent processing, this inter-layer stress is further increased due to different thermal expansions of dissimilar material layers. By modifying the chemical compositions and/or microstructures of adjacent material layers, the plasma over-treatment results in a barrier/liner stack with improved properties such as enhanced adhesion, stronger barrier to interlayer diffusion and resistance to chemical attack during subsequent processing. In particular, film adhesion at the top corners 505C of the via 505 (see FIG. 5e) are improved, and the resultant stack 530 is less susceptible to chemical attack during subsequent metal deposition and post-deposition treatment such as chemical mechanical polishing (CMP) and chemical cleaning, and layering defects such as film peeling can be minimized.

If a $TiCl_4/NH_3$ thermal reaction is used for deposition of the metal nitride layer 508, the as-deposited TiN layer may have a microcrystalline structure, instead of being 100% amorphous. In that case, plasma treatment may also result in enhanced grain growth, and possible changes in crystal orientation. Furthermore, the treated nitride layer also exhibits better barrier characteristics due to a reduced sheet resistance and increased film density.

In another embodiment, the nitrogen-containing plasma 550 also comprises hydrogen, such as that generated from a mixture of $N_2$ and $H_2$, or $NH_3$. Such a plasma, for example, is useful for treating a metal nitride layer 508 having some impurity content. When TDMAT is used as a precursor for TiN deposition, the as-deposited nitride layer 508 comprises a certain amount of carbon and hydrogen impurities, and is sometimes referred to as a titanium carbo-nitride (TiCN) layer. When the as-deposited TiCN layer 508 is exposed to a plasma containing both nitrogen and hydrogen, as shown in FIG. 5d, hydrogen and carbon impurities are displaced by nitrogen, which is incorporated into the TiCN layer 508. Hydrogen from the plasma reacts with carbon impurities to form volatile hydrocarbons that desorb from the TiCN layer 508. As such, the plasma treatment results in a purified TiN layer 509 with reduced carbon content, as well as increased density due to a modified microstructure. Densification of the TiN layer 509, which depends mostly on the presence of nitrogen in the plasma, also occurs more readily for a more stoichiometric TiN layer. It should be noted that an as-deposited TiN layer 508 from a $TiCl_4/NH_3$ reaction will also benefit from the presence of hydrogen in the plasma. In that case, the chlorine content in the as-deposited TiN layer 508 can be reduced by reaction with hydrogen, and a decrease in sheet resistance is also obtained.

When a $N_2/H_2$ plasma is used, $N_2$ is introduced into the chamber at a flow rate of about 100–3000 sccm, preferably about 100–500 sccm, and most preferably about 200–300 sccm; while $H_2$ is introduced at a flow rate of about 150–4500 sccm, preferably about 150–750 sccm, and most preferably about 300–450 sccm. The chamber pressure is maintained in a range of about 1 mtorr–25 torr, but preferably about 1–10 torr, and most preferably about 1 to about 6 torr. The substrate temperature can range from room temperature to about 1000° C., but preferably about 300° C.–500° C. However, specific flow rate and pressure conditions may vary for different processing chambers used.

Alternatively, treatment of the Ti/TiN stack may also be accomplished by thermal annealing at a temperature range of about 350–1100° C. for a time duration between about 0.1 minutes to 1500 minutes.

Figure 6:
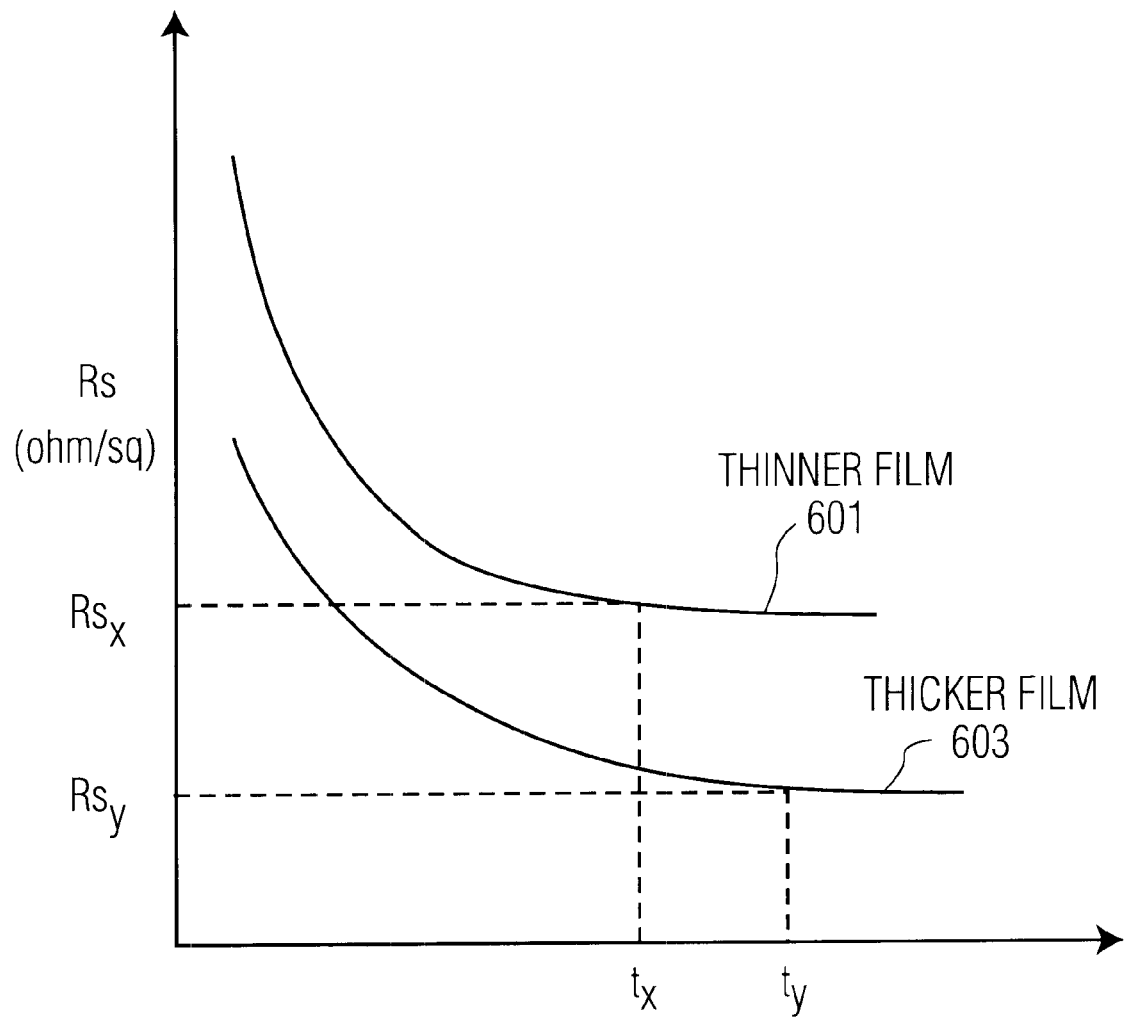
FIG. 6 depicts a plot of sheet resistance as a function of plasma treatment time for different material layers.

In general, the effectiveness of the plasma treatment depends on the thickness of the untreated layer, the treatment time and plasma conditions. At a fixed plasma power and treatment time, the thinner the deposited film, the more effective the treatment. For a given film thickness, however, simply increasing the treatment time may not necessarily be the most efficient process choice. This can be better understood by referring to FIG. 6, which shows a plot of the sheet resistance (Rs) vs. plasma treatment time for two different films 601, and 603. In general, the sheet resistance of a film depends on both the thickness and the microstructure of the film. For two films having the same thickness, a more ordered microstructure tends to result in a lower sheet resistance; while a thinner film will have a higher sheet resistance than a thicker one if they have similar microstructures. As shown in FIG. 6, Rs decreases with increasing treatment time for two films 601 and 603 having similar microstructures but different thicknesses, x and y, where x is less than y. For the thicker film 603, a treatment time $t_y$ is required for the film to reach saturation—i.e., its sheet resistance approaches a limiting value of $Rs_y$, and increasing the treatment time beyond $t_y$ will not result in further decrease of its sheet resistance. On the other hand, the treatment time $t_x$ required to thoroughly treat a thinner film 601 (thickness x)—i.e., to reach its limiting sheet resistance $Rs_x$, is shorter than $t_y$. Since the treatment time for film saturation is not necessarily linear with film thickness, the present invention provides a method by which a thicker film 603 can be formed more efficiently by repeating the deposition and treatment steps for additional cycles. For example, the thinner component film 601 is first deposited and plasma treated according to the present invention. Thereafter, a second, relatively thin, component TiN film is deposited upon the treated film 601 to form a composite film. Thorough plasma treatment of the second component film can be accomplished in a relatively short time. As such, a composite film of a final desired thickness may be fabricated with favorable film characteristics that are otherwise not readily achievable by using a single-step deposition and treatment procedure.

FIGS. 7a–d depict such an alternative embodiment, in which a composite barrier layer is formed by repeating the deposition and plasma treatment steps for additional cycles.

Figure 7A:
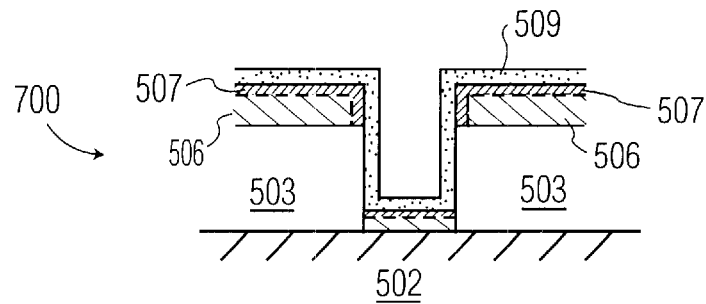
FIGS. 7a–d depict schematic partial sectional views of a substrate showing the formation of a composite metal nitride/metal stack according to another embodiment of the present invention.
Figure 7B:
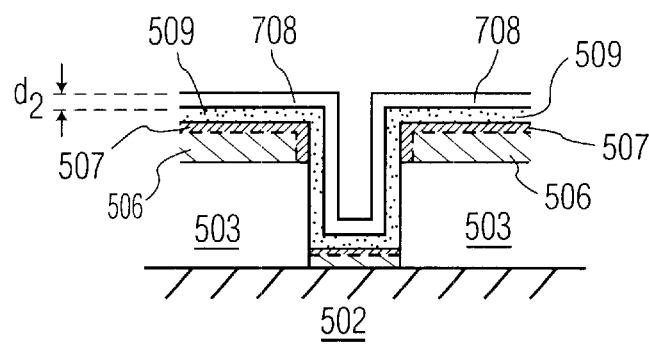
Figure 7C:
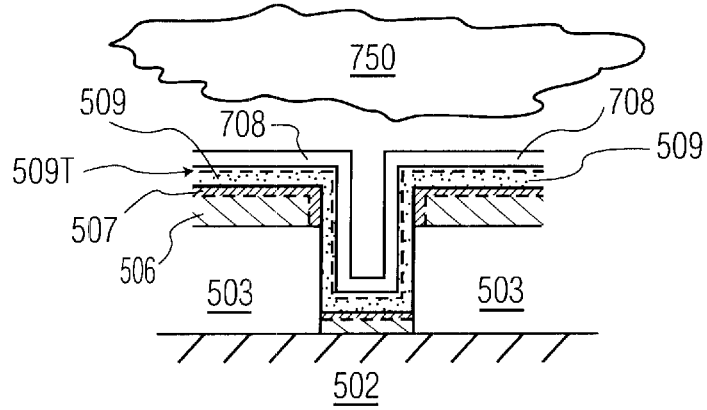
Figure 7D:
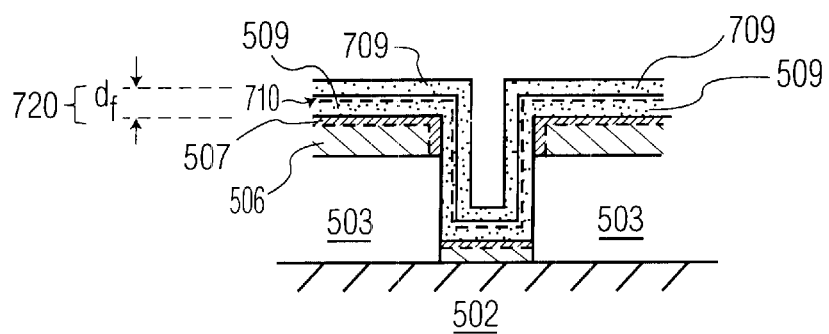

FIG. 7a illustrates the cross-sectional view of a substrate structure 700 after the first plasma treatment previously described. A second barrier layer 708 comprising metal nitride is then deposited upon the treated layer 509, to a thickness $d_2$ of about 5–1000 Å, preferably 60 Å, as shown in FIG. 7b. Although the layer 708 may be deposited under process conditions that are different from those used for the layer 508, it is typical that the same process conditions be used. The as-deposited layer 708 is then exposed to a nitrogen-containing plasma 750, as shown in FIG. 7c. The second plasma treatment is performed for a sufficiently long time to ensure thorough treatment of the entire thickness $d_2$ of the second barrier layer 708, and at least a top portion 509T of the first barrier layer 509. FIG. 7d illustrates the treated barrier layer 709, which may be modified in chemical composition and/or lattice structure compared to the as-deposited layer 708. Similarly, the top portion 509T of the first barrier layer 509 is further modified during the second treatment, and may be denoted as an interface layer 710. As such, structural continuity between the first barrier layer 509 and the second barrier layer 709 is improved. The composite barrier layer 720, comprising the treated barrier layers 709 and 509, has a thickness $d_f$, which is typically less than the sum of $d_1$ and $d_2$ because of film densification by plasma treatment. Further processing steps such as deposition, lithography, etching, implant, and the like, are then performed as appropriate to complete the fabrication of the IC device.

Figure 8A:
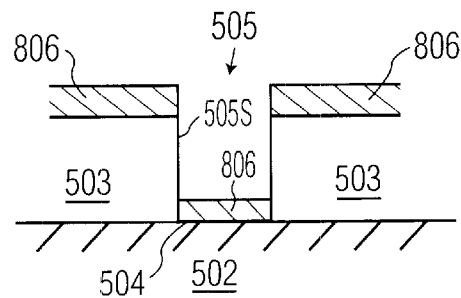
FIGS. 8a–f depict schematic partial sectional views of a substrate structure illustrating another embodiment of the present invention.
Figure 8B:
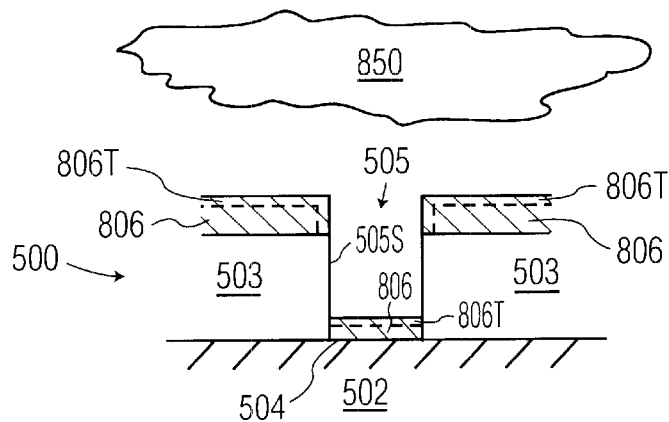
Figure 8C:
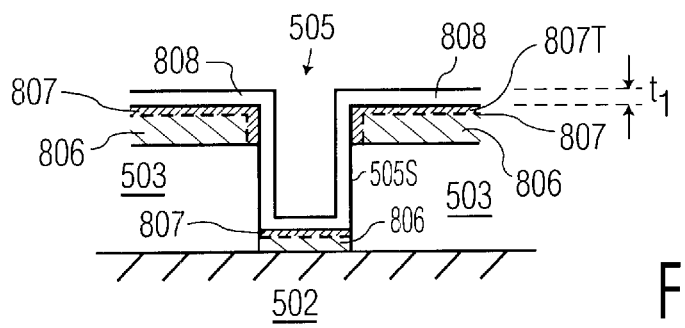

FIGS. 8a–f illustrate yet another embodiment of the invention, in which a metal layer 806 is plasma treated prior to metal nitride deposition. FIG. 8a shows the metal layer 806 which has been deposited upon a substrate structure 500 such as that depicted in FIG. 5a. The metal layer 806, e.g., Ti, Ta or W, may be deposited from sputtering a metal target in a PVD chamber, or may also be formed by a CVD technique. FIG. 8b illustrates the as- deposited metal layer 806 being exposed to a nitrogen-containing plasma 850, which may comprise a variety of gases, such as $N_2$ or $NH_3$, among others. During treatment, active species from the plasma 850 bombards a top or outer portion 806T of the metal layer 806, including the vertical sidewall. A thin metal nitride layer 807 (or nitrated-metal layer) is formed after this plasma step, as shown in FIG. 8c. The plasma treatment of the metal layer 806 can be performed in the same chamber used for the deposition of the metal layer 806. Although a plasma is the preferred method of film treatment or annealing, thermal annealing may also be used to facilitate nitration of the metal layer 806.

Alternatively, plasma treatment of the metal layer 806 may be performed in the chamber used for subsequent metal nitride deposition. In that case, an additional benefit can be realized—that of substrate pre-conditioning. In general, film deposition processes are temperature dependent, and a single-wafer processing chamber may exhibit a "first wafer" effect. That is, the temperature in the chamber may not be stabilized when the first wafer in a batch is being processed. As such, the film deposited on the first wafer may have a slightly different thickness, or uniformity, compared to subsequently processed wafers. However, if the plasma treatment of the metal layer 806 is performed in the same CVD chamber as that used for subsequent metal nitride deposition, each wafer in the batch, including the first wafer, is heated to about the same temperature by the treating plasma prior to nitride deposition. Such wafer pre-conditioning is effective in improving wafer-to-wafer reproducibility in the deposited metal nitride film.

FIG. 8c illustrates a metal nitride layer 808, preferably comprising the same refractory metal as the metal layer 806, being deposited to a thickness $t_1$ upon the nitrated-metal layer 807. The thickness $t_1$ may be in the range of about 5–1000 Å, and preferably about 60 Å. The nitrated-metal layer 807 serves as an interfacial link, and provides an improved lattice matching between the untreated metal layer 806 and the nitride layer 808. In some cases, e.g., when the metal nitride layer 808 is TiN deposited from a reaction between $TiCl_4$ and $NH_3$, the TiN layer 808 may also be "seeded" by the nitrated-metal layer 807. That is, the nitride layer 808 may have a preferred crystal orientation similar to that of the nitrated-metal layer 807.

Figure 8D:
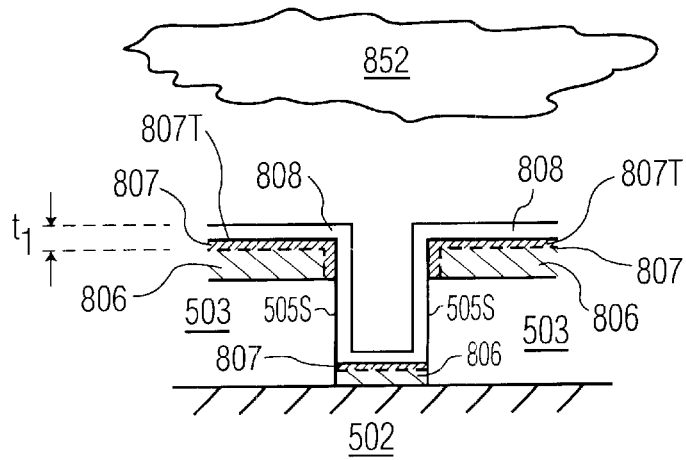
Figure 8E:
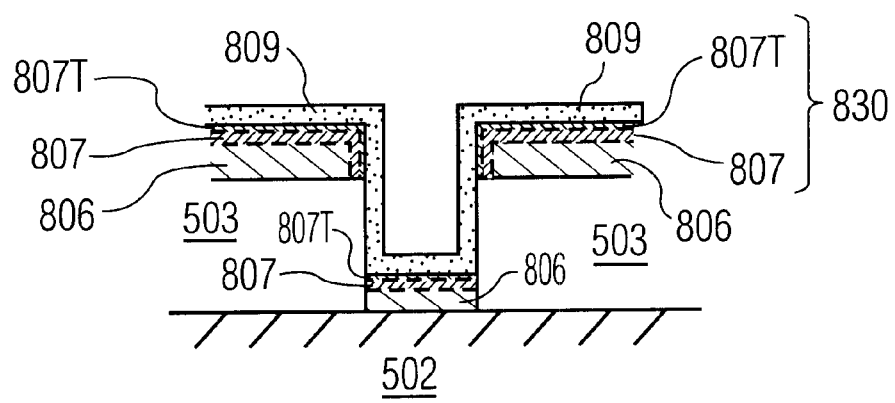

FIG. 8d illustrates the as-deposited metal nitride layer 808 being subjected to a plasma treatment step according to the present invention. The plasma 852 may be a nitrogen-containing plasma, comprising for example, $N_2$ or $NH_3$. Again, the entire metal nitride layer 808 and at least a top portion 807T of the underlying nitrated-metal interfacial layer 807 are treated such that they are modified in terms of lattice structure and/or chemical composition. Enhanced lattice structure matching from the plasma treatment results in a metal nitride/metal stack 830 (shown in FIG. 8e, comprising the modified nitride layer 809, the treated nitrated-metal portion 807T, the nitrated-metal layer 807, and the untreated metal layer 806) with improved barrier/liner characteristics. Typically, due to film densification, the treated nitride layer 809 has a thickness that is less than $t_1$. Optionally, the plasma treatment step may also be performed to further treat a portion of the underlying metal layer 806 (adjacent to the nitrated-metal layer 807), e.g., by extending the treatment time and/or modifying the plasma conditions.

Figure 8F:
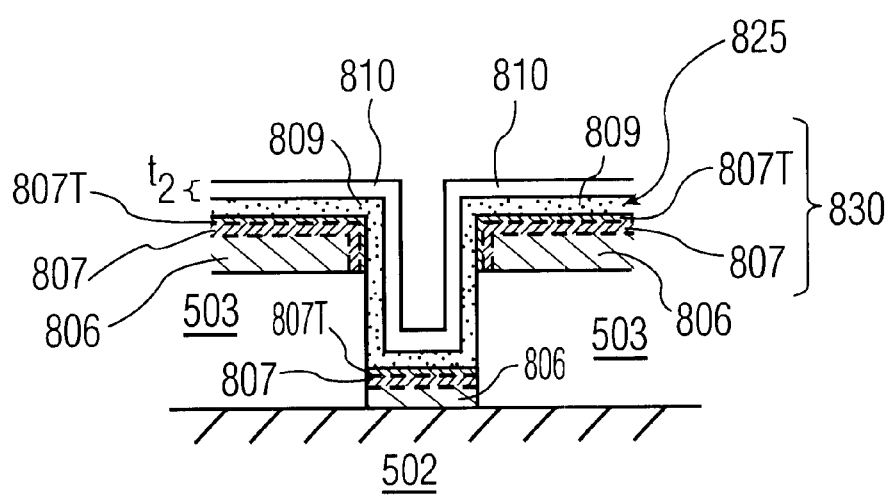

Depending on the specific applications, the nitride/metal stack 830 may be used as a barrier/liner in a metallization scheme. Alternatively, if a thicker nitride layer is desired, the nitride deposition and treatment steps may be repeated for additional cycles. This is illustrated in FIG. 8f, in which a second nitride layer 810 is deposited to a thickness $t_2$ in the range of about 5–1000 Å, preferably about 60 Å, upon the metal stack 830. The as-deposited nitride layer 810 is then exposed to a nitrogen-containing plasma 854, which may or may not be identical to plasma 852.

The plasma 854 is used to treat the entire second nitride layer 810 and a top portion of the underlying nitride layer 809. The primary purpose of this treatment step is to provide an improved interface 825 between the second nitride layer 810 and the first nitride layer 809. Additional nitride layers may be deposited and plasma treated to yield a composite nitride layer of desired final thickness.

In general, a process comprising the formation of a composite layer by repeated deposition and treatment of component layers can be denoted as a "NxD" process; where N is the number of deposition-treatment cycles, and D is the thickness of the plasma-treated component layer. One of the advantages of this approach is that it results in a composite layer having more uniform properties, because the thinner component layers allow a more thorough plasma treatment, including portions deposited along the sidewall 505S of the contact hole 505.

"2×20" Process in HP TxZ Chamber

In one specific example, a composite TiN film or layer having a thickness of about 40 Å is formed upon an underlying Ti layer in a "2×20" process performed in a HP TxZ chamber.

This process involves two cycles of forming 20 Å thick TiN.

Each cycle comprises two steps: first, depositing a film comprising TiN of about 60 Å; and second, exposing the deposited film to a plasma environment comprising $N_2$ and hydrogen ($H_2$). The plasma treatment results in a densified film having a typical thickness of about 20 Å, and a sheet resistance of about 1500 ohm/sq. Similar to other embodiments previously described, this embodiment is generally applicable to contact and via levels.

Table 1 illustrates several key steps in a typical 2×20 process recipe for the treatment and deposition of TiN.

TABLE 1

Recipe for TiN "2 × 20" Process

|  | #1 Dep1 | #2 Pls1 | #3 Cooldown | #4 Dep2 | #5 Pls2 |
|---|---|---|---|---|---|
| Inert Dil. (sccm) | 1300 | — | 1900 | 1300 | — |
| He Car. (sccm) | 325 TDMAT | — | 325 No TDMAT | 325 TDMAT | — |
| N2 (sccm) |  | 300 |  |  | 300 |
| H2 (sccm) |  | 450 |  |  | 450 |
| Pressure (torr) | 5.0 | 1.3 | 5.0 | 5.0 | 1.3 |
| RF Power (W) | 0 | 750 | 0 | 0 | 750 |
| Time (sec) | 18 | 20 | 5 | 18 | 20 |

After a proper pump-down and gas flow stabilization Go inside the HP TxZ chamber, a wafer, e.g., one having a previously deposited adhesion layer, is retained upon the pedestal. Typically, backside pressure control is enabled such that a pressure difference of about 1.5 torr is maintained between the front and the backside of the wafer throughout the entire process recipe. The heater temperature is typically set at about 365° C., with the edge purge and bottom purge gas flows at about 1500 sccm and 1000 sccm, respectively.

Inert dilutant and carrier gas flows are also established prior to the deposition of the first barrier layer, which is shown in step #1. Gases such as $N_2$, Ar, He and $H_2$, among others, are suitable for use as dilutant gases and a total flow rate of about 1300 sccm may be used. TDMAT is introduced into the chamber by passing a He carrier gas through a bubbler or ampoule containing TDMAT at a temperature of about 50° C. Alternatively, liquid injection of TDMAT may also be used. A TiN layer of about 60 Å, for example, is deposited upon the wafer after step #1.

Plasma treatment of the as-deposited TiN layer is performed in step #2, using $N_2$ and $H_2$ precursors at flow rates of about 300 sccm and 450 sccm, respectively. The chamber pressure is maintained at about 1.3 torr, while an RF power of about 750 W is applied to the showerhead. After exposing the TiN layer to the $N_2/H_2$ plasma for about 20 seconds, a final TiN layer of about 20 Å is obtained. The wafer, which is heated up during the plasma treatment step, is allowed to cool down in step #3, during which no TDMAT is supplied to the chamber. By maintaining the wafer at about the same temperature prior to the first and second TiN deposition steps, thickness reproducibility of the first and second TiN layers can be assured.

A second TiN layer is subsequently deposited in step #4, preferably under the same conditions as that of step #1, followed by a second plasma treatment step #5. After step #5, a TiN layer having a final thickness of about 40 Å is formed upon the wafer, and the chamber is purged with an inert gas, e.g., $N_2$, prior to the removal of the wafer.

The various embodiments of the present invention are generally applicable to forming metal nitride/metal stacks in CVD W, Al and Cu metallization schemes, as well as to any contact and via levels. In forming the metal nitride/metal structure of the present invention, the metal layer may be formed by conventional means known in the art over a variety of different substrates including silicon, thermal oxides and ceramics, among others. Furthermore, the process of the present invention can be performed over a variety of patterned wafers having different combinations of underlying and interconnecting layers of various materials.

A skilled practitioner in the art will understand the need to modify process parameters or choice of equipment, while retaining the basic nature of the process of the invention and desired film characteristics.

What is claimed is:

1. A method of processing a substrate, comprising the steps of:
    (a) depositing a nitride layer upon a metal layer to form an interface between said nitride layer and said metal layer, wherein said nitride layer is formed in the presence of a metallo-organic compound comprising titanium;
    (b) providing a nitrogen/hydrogen-containing environment; and
    (c) modifying said nitride layer and at least a portion of said metal layer below said interface by exposing said nitride layer to said nitrogen/hydrogen-containing environment.

2. The method of claim 1, wherein said metallo-organic compound is tetrakis-dimethylamino-titanium (TDMAT).

3. The method of claim 1, wherein said step (c) comprises adding nitrogen to said portion of said metal layer below said interface.

4. The method of claim 1, wherein said modifying step (c) comprises reducing microstructure mismatch across said interface formed in said step (a).

5. The method of claim 1, wherein said metal layer comprises titanium (Ti), tantalum (Ta) or tungsten (W) and said nitride layer comprises titanium nitride, tantalum nitride or tungsten nitride.

6. The method of claim 1 wherein said nitride layer of said step (a) further comprises carbon or chlorine.

7. The method of claim 6, wherein said modifying step (c) comprises reducing carbon or chlorine from said nitride layer and changing microstructure of said portion of said metal layer below said interface.

8. The method of claim 1, further comprising the steps of:
    (d) after step (c), depositing a nitride layer upon said modified nitride layer to form a nitride-nitride interface;
    (e) modifying said deposited nitride layer of step (d) and at least a portion of said modified nitride layer from step (c) by exposing said deposited nitride layer to a nitrogen-containing environment.

9. The method of claim 8, wherein said modifying step (e) comprises reducing microstructure mismatch across said nitride-nitride interface of step (d).

10. A method of processing a substrate, comprising the steps of:
    (a) depositing a nitride layer upon a metal layer to form an interface between said nitride layer and said metal layer;
    (b) providing a nitrogen-containing plasma; and
    (c) modifying said nitride layer and at least a portion of said metal layer below said interface by exposing said nitride layer to said nitrogen-containing plasma.

11. The method of claim 10, wherein said nitride layer of said step (a) further comprises carbon or chlorine, and said nitrogen-containing plasma in said step (c) further comprises hydrogen.

12. The method of claim 10, wherein said step (a) is performed in the presence of a metallo-organic compound comprising titanium.

13. The method of claim 12, wherein said metallo-organic compound is tetrakis-dimethylamino-titanium (TDMAT).

14. The method of claim 10, further comprising the steps of:
   (d) after step (c), depositing a nitride layer upon said modified nitride layer to form a nitride-nitride interface;
   (e) modifying said deposited nitride layer of step (d) and at least a portion of said modified nitride layer from step (c) by exposing said deposited nitride layer to a nitrogen-containing plasma.

15. The method of claim 14, wherein said modifying step (e) comprises reducing microstructure mismatch across said nitride-nitride interface of step (d).

16. A method for processing a substrate, comprising the steps of:
   (a) depositing a first nitride layer upon a metal layer to form a first interface between said first nitride layer and said metal layer;
   (b) providing a first nitrogen-containing environment;
   (c) modifying said first nitride layer of step (a) and at least a portion of said metal layer of step (a) by exposing said first nitride layer to said first nitrogen-containing environment; wherein nitrogen is added to said portion of said metal layer in the vicinity of said first interface;
   (d) depositing a second nitride layer upon said first nitride layer after said modifying step (c) to form a second interface between said first nitride layer and said second nitride layer;
   (e) providing a second nitrogen-containing environment; and
   (f) modifying said second nitride layer and at least a portion of said first nitride layer in the vicinity of said second interface by exposing said second nitride layer to said second nitrogen-containing environment.

17. The method of claim 16, wherein said modifying step (c) comprises reducing microstructure mismatch across said first interface between said metal layer and first nitride layer.

18. The method of claim 16, wherein said first nitride layer of said step (a) further comprises carbon or chlorine and said modifying step (c) comprises reducing carbon or chlorine from said first nitride layer.

19. The method of claim 16, wherein said metal layer of step (a) comprises Ti, Ta or W and said first nitride layer comprises TiN, TaN or WN.

20. The method of claim 16, wherein said first nitrogen-containing environment and said second nitrogen-containing environment further comprise hydrogen.

21. The method of claim 16, wherein said modifying step (f) comprises reducing microstructure mismatch across said second interface formed between said first nitride layer and said second nitride layer.

22. The method of claim 16, wherein said first nitrogen-containing environment is a first plasma and said second nitrogen-containing environment is a second plasma.

23. A method for processing a substrate, comprising the steps of:
   (a) forming a metal layer upon a substrate;
   (b) exposing said metal layer to a first nitrogen-containing environment to form a nitrated-metal layer from at least a top portion of said metal layer;
   (c) depositing a nitride layer upon said nitrated-metal layer to form an interface between said nitride layer and said nitrated-metal layer;
   (d) modifying said nitride layer and at least a portion of said nitrated-metal layer adjacent said first interface by exposing said nitride layer of said step (c) to a second nitrogen-containing environment.

24. The method of claim 23, further comprising the steps of:
   (e) after step (d), depositing a nitride layer upon said plasma-modified nitride layer to form a nitride-nitride interface,
   (f) forming a nitrogen-containing plasma; and
   (g) modifying said nitride-nitride interface by exposing said deposited nitride layer of step (e) to said nitrogen-containing plasma of step (f).

25. The method of claim 24, wherein said modifying step (g) comprises reducing microstructure mismatch across said nitride-nitride interface.

* * * * *

UNITED STATES PATENT AND TRADEMARK OFFICE
CERTIFICATE OF CORRECTION

PATENT NO. : 6,436,819 B1
DATED : August 20, 2002
INVENTOR(S) : Zhi-Fan Zhang et al.

It is certified that error appears in the above-identified patent and that said Letters Patent is hereby corrected as shown below:

Column 13,
Line 27, after "gas flow stabilization", please delete "GO".

Signed and Sealed this

Eleventh Day of February, 2003

JAMES E. ROGAN
*Director of the United States Patent and Trademark Office*